(12) United States Patent
Chen et al.

(10) Patent No.: US 11,670,874 B2
(45) Date of Patent: Jun. 6, 2023

(54) BROADBAND DUAL-POLARIZED SOLAR CELL ANTENNA AND ANTENNA ARRAY

(71) Applicant: The 38th Research Institute of China Electronics Technology Group Corporation, Hefei (CN)

(72) Inventors: Qian Chen, Hefei (CN); Zichao Li, Hefei (CN); Jia Fang, Hefei (CN); Quan Wang, Hefei (CN); Xiaolin Zhang, Hefei (CN); Mouping Jin, Hefei (CN); Yuefei Dai, Hefei (CN); Yinglu Wan, Hefei (CN)

(73) Assignee: The 38th Research Institute of China Electronics Technology Group Corporation, Hefei (CN)

( * ) Notice: Subject to any disclaimer, the term of this patent is extended or adjusted under 35 U.S.C. 154(b) by 0 days.

(21) Appl. No.: 17/819,951

(22) Filed: Aug. 16, 2022

(65) Prior Publication Data

US 2022/0393369 A1     Dec. 8, 2022

Related U.S. Application Data

(63) Continuation of application No. PCT/CN2020/082770, filed on Apr. 1, 2020.

(30) Foreign Application Priority Data

Feb. 25, 2020 (CN) .......................... 202010122274.3

(51) Int. Cl.
*H01Q 21/24* (2006.01)
*H01L 27/142* (2014.01)
(Continued)

(52) U.S. Cl.
CPC ........... *H01Q 21/24* (2013.01); *H01L 27/142* (2013.01); *H01P 3/06* (2013.01); *H01Q 9/28* (2013.01)

(58) Field of Classification Search
CPC .......... H01Q 21/24; H01Q 9/28; H01Q 9/065; H01L 27/142; H01P 3/06
See application file for complete search history.

(56) References Cited

U.S. PATENT DOCUMENTS

| | | | |
|---|---|---|---|
| 2017/0025767 A1 | 1/2017 | Elsallal et al. | |
| 2018/0040955 A1* | 2/2018 | Vouvakis | ............... H01Q 9/065 |

(Continued)

FOREIGN PATENT DOCUMENTS

| | | |
|---|---|---|
| CN | 103247848 A | 8/2013 |
| CN | 106711576 A | 5/2017 |

(Continued)

OTHER PUBLICATIONS

Yurduseven, Okan et al., A Dual-Polarized Solar Cell Stacked Microstrip Patch Antenna with a λ/4 DC/RF Isolation Circuit for 5.8 GHz Band WiMAX Networks, The 8th European Conference on Antennas Propagation, IEEE, Apr. 11, 2014, abstract, NL.

(Continued)

*Primary Examiner* — Dieu Hien T Duong
(74) *Attorney, Agent, or Firm* — True Shepherd LLC; Andrew C. Cheng

(57) ABSTRACT

The present disclosure provides a broadband dual-polarized solar cell antenna and an antenna array. The broadband dual-polarized solar cell antenna includes an antenna dipole layer, an isolation layer, a solar cell layer, and a ground that are arranged sequentially from top to bottom, where the antenna dipole layer is connected to the ground and a radio frequency (RF) coaxial connector through a metal feeding probe structure, the solar cell layer is placed on the ground, the isolation layer is located between the antenna dipole layer and the solar cell layer, and the isolation layer is made of a transparent material. The present disclosure is small in sunlight shielding and high in transparency, and has a broadband dual-polarized wide-angle scanning capability, (Continued)

which ensures performance of the antenna and power generation efficiency of the solar cell, and is highly applicable in engineering.

8 Claims, 6 Drawing Sheets

(51) Int. Cl.
*H01P 3/06* (2006.01)
*H01Q 9/28* (2006.01)

(56) References Cited

U.S. PATENT DOCUMENTS

2018/0302149 A1  10/2018  Park et al.
2019/0356058 A1  11/2019  Martin et al.

FOREIGN PATENT DOCUMENTS

| CN | 206471492 U | 9/2017 |
| CN | 206628592 U | 11/2017 |
| CN | 109103609 A | 12/2018 |
| CN | 109888481 A | 6/2019 |
| CN | 110112543 A | 8/2019 |

OTHER PUBLICATIONS

Son Xuat Ta, et al., A Circularly Polarized Antenna Integrated with a Solar Cell Metasurface for CubeSat, Proceedings of 2018 Asia-Pacific Microwave Conference, IEEE, Jan. 17, 2019, pp. 696-698, JP.

Sajjad Hussain, et al., A Compact Wideband, Wide-Scan Millimeter-Wave Antenna Array for 5G Wireless Applications, ICC 2019—2019 IEEE International Conference on Communications (ICC), IEEE, Jul. 15, 2019, pp. 1-5, CN.

Internation Search Report of PCT/CN2020/082770, dated Dec. 1, 2020.

* cited by examiner

BROADBAND DUAL-POLARIZED SOLAR CELL ANTENNA AND ANTENNA ARRAY

CROSS-REFERENCE TO RELATED APPLICATIONS

This application is a continuation of International Patent Application No. PCT/CN2020/082770 with a filing date of Apr. 1, 2020, designating the United States, now pending, and further claims priority to Chinese Patent Application No. 202010122274.3 with a filing date of Feb. 25, 2020. The content of the applications mentioned above, including any intervening amendments thereto, are incorporated herein by reference.

TECHNICAL FIELD

The present disclosure relates to the field of antenna devices, particularly a broadband dual-polarized solar cell antenna and an antenna array.

BACKGROUND ART

As a device for converting solar energy into electrical energy, a solar cell has been widely applied to solar power stations, rooftop power generation arrays, solar street lamps, solar-powered aircrafts, steamships, vehicles, etc. An antenna as an electromagnetic transceiver has been widely applied to various communication devices, electromagnetic exploration devices, etc. For the array antenna and the solar cell, a certain aperture area is required to ensure an effective gain and collect sunlight. A novel device with an integrated design is produced, which possesses the functions of both the antenna and the solar cell. Moreover, electrical energy generated by the solar cell can be directly used to the antenna system in a distributed manner, which shortens the power supply line and reduces the transmission loss compared with an external centralized power supply manner.

Presently, literature on integration of the solar cell and the antenna has been reported. Yet, most of them mainly focus on a single-polarized antenna with a narrow operating bandwidth and a significant impact on the performance of the solar cell, but the integration of the solar cell with a broadband dual-polarized antenna is reported rarely.

The present disclosure is proposed to overcome the above defects after long-term research and practices on the subject matter.

SUMMARY

The present disclosure employs the following technical solutions to solve the above technical defects: The present disclosure provides a broadband dual-polarized solar cell antenna, including an antenna dipole layer, an isolation layer, a solar cell layer, and a ground, from top to bottom. The antenna dipole layer is connected to the ground and radio frequency (RF) coaxial connectors through metal feeding probe structure. The solar cell layer is placed on the ground of the antenna. The isolation layer is located between the antenna dipole layer and the solar cell layer, and the isolation layer is made of a transparent material.

Preferably, the antenna dipole layer may include a dual-polarized dipole, a parasitic patch, and a substrate. The dual-polarized dipole is arranged on the upper surface of the substrate. The parasitic patch is arranged on the back surface of the substrate. The substrate is made of a transparent material.

Preferably, the dual-polarized dipole may be of a "hollowed-out tie" shape, which may include a vertically polarized dipole and a horizontally polarized dipole. The vertically polarized dipole and the horizontally polarized dipole are arranged orthogonally in an L shape. The vertically polarized dipole and the horizontally polarized dipole are connected to the ground through the metal feeding probe structure. The parasitic patch is located at the crisscrossing points of each four adjacent dipoles on the back surface of the glass substrate.

Preferably, the parasitic patch is a circular metal-meshed patch.

Preferably, the vertically polarized dipole and the horizontally polarized dipole both have a linear polarized structure which is a tie-shaped ring enclosed by a plurality of metal line segments. Each of the vertically polarized dipole and the horizontally polarized dipole includes a first dipole portion and a second dipole portion symmetrical to each other. The first dipole portion is not in communication with the second dipole portion. The first dipole portion and the second dipole portion both have a hollow design. Two opposite ends of the first dipole portion and the second dipole portion include a metal portion for connecting the metal feeding probe structure.

Preferably, the metal feeding probe structure includes a metal ground probe and a metal feeding probe. Both the metal ground probe and the metal feeding probe are perpendicular to the ground. The metal ground probe is cylindrical or rectangular. The metal feeding probe is cylindrical. A ground weld pin is defined on the upper end of the metal ground probe. A feeding weld pin is defined on the upper end of the metal feeding probe. Both the ground weld pin and the feeding weld pin are connected to the dual-polarized dipole.

Preferably, both the ground weld pin and the feeding weld pin are cylindrical. The diameter of the feeding weld pin is not greater than the diameter of the metal feeding probe. The diameter of the ground weld pin is less than the side-length or the diameter of the metal ground probe. The height of each of the ground weld pin and the feeding weld pin is greater than the thickness of the substrate.

Preferably, the lower end of the metal ground probe is connected to the ground. The lower end of the metal feeding probe is connected to a positive electrode of the RF coaxial connector. The RF coaxial connector is arranged in the ground. A cylindrical air feeding hole is formed between the RF coaxial connector and the upper surface of the ground.

Preferably, the solar cell layer includes a solar cell and an insulating film. The solar cell is isolated from the ground through the insulating film. The solar cell and the insulating film each have a circular hole at the metal feeding probe and the metal ground probe.

The present disclosure proposes an antenna array which is formed by a plurality of the dual-polarized solar cell antennas in a square grid array. In the antenna array, the vertically polarized dipole and the horizontally polarized dipole are arranged periodically. Pluralities of parasitic dipoles are arranged at four peripheral sides of the antenna array. An outside endpoint of the parasitic dipole is connected to a parasitic metal ground probe.

The present disclosure has the following beneficial effects over the prior art: 1. The antenna of the present disclosure has small sunlight shielding, high transparency, and a broadband dual-polarized wide-angle scanning capability. This ensures the performance of the antenna and power generation efficiency of the solar cell, and makes the antenna highly applicable in engineering. 2. The present disclosure combines the performance of the antenna and the performance of the solar cell well. Due to the "hollowed-out tie"-shaped dipole, the antenna covers a broad operating bandwidth and has a desirable sunlight transmission. With the feeding structure including the perpendicular and parallel metal ground probe and metal feeding probe, the present disclosure realizes broadband feeding of the antenna. The perpendicular feeding probe is also beneficial in reducing the sunlight shielding. Moreover, the metal probe can further support the antenna dipoles. 3. As the electrical energy generated by the solar cell can be available to the antenna system, the broadband dual-polarized solar cell antenna can be applied to solar street lamps, rooftop solar panels, satellite solar panels, etc. Because of a broadband dual-polarized working capability, the broadband dual-polarized solar cell antenna is particularly applied to fifth-generation (5G) low-frequency sub-6 GHz transceiver terminals such as a 5G Internet of vehicles (IOV) and a 5G base transceiver station (BTS), with the high creativity.

1—dual-polarized dipole, 2—parasitic patch, 3—substrate, 4—isolation layer, 5—solar cell, 6—insulating film, 7—ground, 8—RF coaxial connector, 9—metal ground probe, 10—metal feeding probe, 11—feeding weld pin, 12—ground weld pin, 13—air feeding hole, 14—circular hole, 15—first solar cell lead, 16—second solar cell lead, 20—vertically polarized dipole, 21—horizontally polarized dipole, 22—parasitic dipole, and 23—parasitic metal ground probe.

DETAILED DESCRIPTION OF THE EMBODIMENTS

The above and other technical features and advantages of the present disclosure will be described below in more detail in connection with the accompanying drawings.

Embodiment 1

Figure 1:
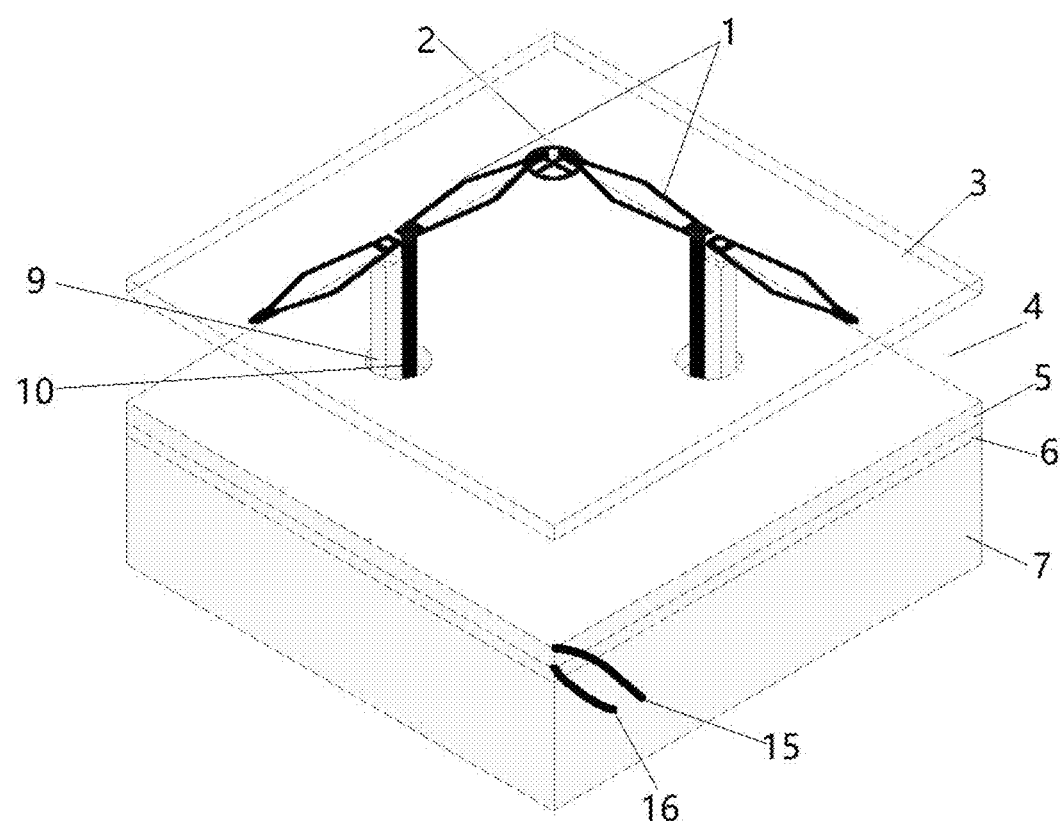
FIG. 1 is a perspective view of a broadband dual-polarized solar cell antenna.
Figure 2:
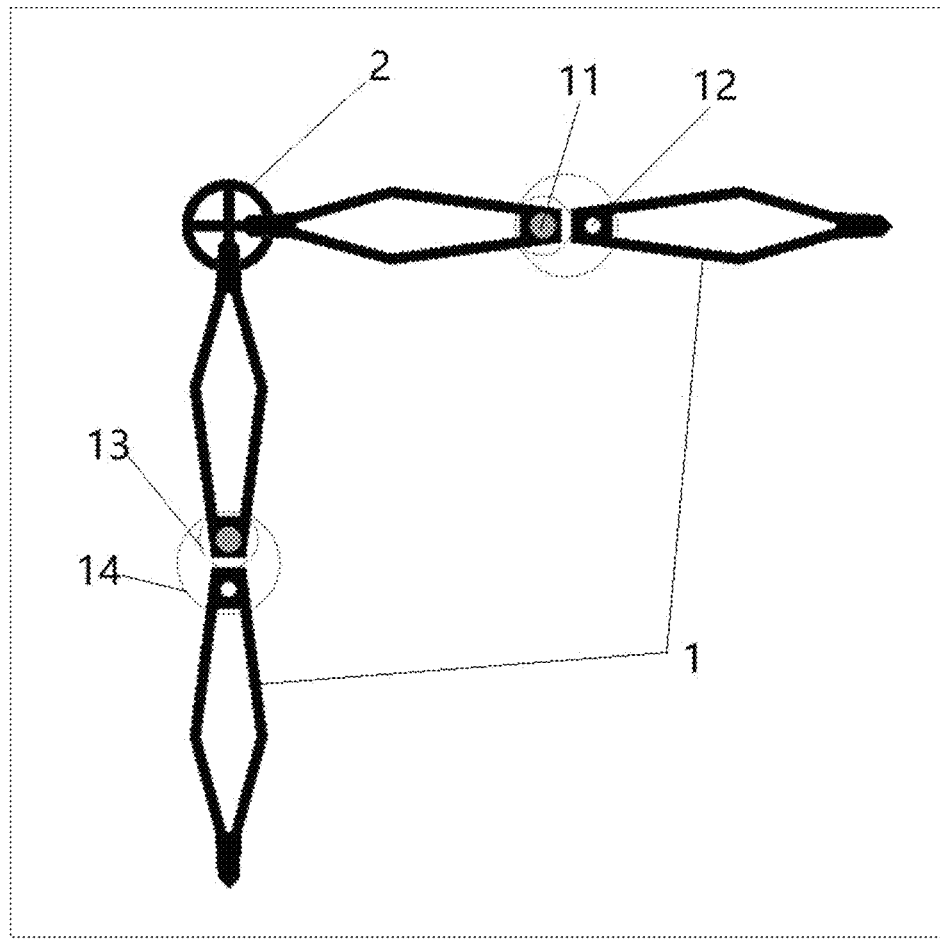
FIG. 2 is a top view of a broadband dual-polarized solar cell antenna.
Figure 3:
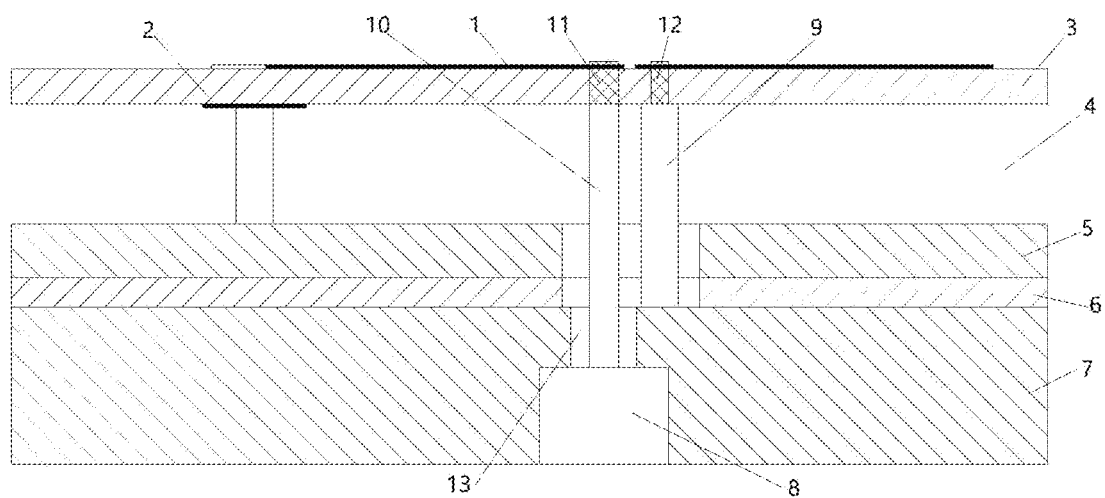
FIG. 3 is a sectional view of a broadband dual-polarized solar cell antenna.

As shown in FIG. 1, FIG. 2, and FIG. 3, FIG. 1 is a perspective view of a broadband dual-polarized solar cell antenna, FIG. 2 is a top view of a broadband dual-polarized solar cell antenna, and FIG. 3 is a sectional view of a broadband dual-polarized solar cell antenna.

The broadband dual-polarized solar cell antenna includes an antenna dipole layer, an isolation layer 4, a solar cell layer, and a ground 7 that are arranged sequentially from top to bottom. The antenna dipole layer is connected to the ground 7 and an RF coaxial connector 8 through a metal feeding probe structure. The solar cell layer is placed on the ground 7. The isolation layer 4 is located between the antenna dipole layer and the solar cell layer.

The antenna dipole layer includes a dual-polarized dipole 1, a parasitic patch 2, and a substrate 3. The dual-polarized dipole 1 is arranged on the upper surface of the substrate 3. The parasitic patch 2 is arranged on the back surface of the substrate 3.

The dual-polarized dipole 1 is of a "hollowed-out tie" shape, and includes a vertically polarized dipole 20 and a horizontally polarized dipole 21. The vertically polarized dipole 20 and the horizontally polarized dipole 21 are arranged orthogonally in an L shape. The vertically polarized dipole 20 and the horizontally polarized dipole 21 are connected to the ground 7 through the metal feeding probe structure.

The substrate 3 is made of a transparent medium. Usually, it is made of a material such as transparent glass and transparent resin, preferably a high-transmittance material, to reduce impacts on lighting of the solar cell.

The dual-polarized dipole 1 is arranged on the upper surface of the substrate 3. The parasitic patch 2 is located at the crisscrossing points of each four adjacent dipoles on the back surface of the substrate 3.

The parasitic patch 2 is a circular metal-meshed patch. The metal pattern of the parasitic patch 2 is used to expand the operating bandwidth of the antenna, with a small occupied area and less light shielding.

Preferably, the vertically polarized dipole 20 and the horizontally polarized dipole 21 each are of a linear polarized structure which is a tie-shaped ring enclosed by a plurality of metal line segments. Each of the vertically polarized dipole and the horizontally polarized dipole includes a first dipole portion and a second dipole portion symmetrical to each other. The first dipole portion does not communicate with the second dipole portion, and there is a certain gap therebetween. Specifically, the first dipole portion and the second dipole portion are internally hollow. Two opposite ends of the first dipole portion and the second dipole portion include a small metal pattern for connecting the metal feeding probe structure. The dual-polarized dipole 1 of the "hollowed-out tie" shape is mainly intended to reduce the pattern area of the dipole and the sunlight shielding for the solar cell. Moreover, the structure of the dipole covers a broad operating bandwidth.

It is to be noted that the parasitic patch 2 which is the circular metal meshed patch is shared by four adjacent dipoles, two vertically polarized dipoles 20 and two horizontally polarized dipoles 21. The parasitic patch 2 is arranged under a crisscrossing point for the vertically polarized dipoles 20 and the horizontally polarized dipoles 21.

The isolation layer 4 is a transparent medium isolation layer 4. The isolation layer 4 may be air, glass, transparent resin, and the like, preferably the high-transmittance material. In the embodiment, the air serves as the transparent medium isolation layer 4.

The solar cell layer includes a solar cell 5 and an insulating film 6. The solar cell 5 is isolated from the ground 7 through the insulating film 6.

The metal feeding probe structure includes a metal ground probe 9 and a metal feeding probe 10. Both the metal ground probe 9 and the metal feeding probe 10 are perpendicular to the ground 7. The metal ground probe 9 is cylindrical or rectangular. The metal feeding probe 10 is cylindrical. The metal ground probe 9 has a ground weld pin 12 at the upper end. The metal feeding probe 10 has a feeding weld pin 11 at the upper end.

Both the ground weld pin 12 and the feeding weld pin 11 are cylindrical. The diameter of the feeding weld pin 11 is not greater than the diameter of the metal feeding probe 10. The diameter of the ground weld pin 12 is less than the side-length or the diameter of the metal ground probe 9.

The substrate 3 is provided with connecting holes corresponding to the ground weld pin 12 and the feeding weld pin 11, which ensures that the ground weld pin 12 and the feeding weld pin 11 are connected to the dual-polarized dipole 1 on the upper surface of the base 3. The height of each of the ground weld pin 12 and the feeding weld pin 11 is slightly greater than the thickness of the substrate 3, such that the ground weld pin 12 and the feeding weld pin 11 are welded with the dual-polarized dipole 1.

The lower end of the metal ground probe 9 is connected to the ground 7. The lower end of the metal feeding probe 10 is connected to a positive electrode of the RF coaxial connector 8. The RF coaxial connector 8 is provided in the ground 7. In the embodiment, a probe of the RF coaxial connector 8 serves as the metal feeding probe 10, to ensure the continuity of the metal feeding probe 10.

It is to be noted that the metal ground probe 9 and the metal feeding probe 10 further support the antenna dipole layer to ensure an overall structure of the broadband dual-polarized solar cell antenna.

A cylindrical air feeding hole 13 having a certain height is formed between the RF coaxial connector 8 and the upper surface of the ground 7. The feeding hole may be used to adjust the feeding matching of the antenna. The air feeding hole 13 for the feeding matching can improve a voltage standing wave ratio (VSWR) of the antenna. Because of a small diameter of the air feeding hole 13, the metal ground probe 9 and the metal feeding probe 10 are arranged closely to improve the feeding performance of the antenna.

The solar cell 5 and the insulating film 6 each are provided with a circular hole 14 at the metal feeding probe 10 and the metal ground probe 9, such that the metal feeding probe 10 and the metal ground probe 9 do not contact the solar cell 5.

Pluralities of the solar cells 5 are connected by rectangular grid leads to collect electrical energy. Each of the upper and lower sides of the solar cell 5 is connected with an electrode respectively. A collection line is led out from the two electrodes. Specifically, the collection line includes a first solar cell lead 15 and a second solar cell lead 16. The solar cell 5 can be connected to the antenna system through the first solar cell lead 15 and the second solar cell lead 16, thereby supplying power to the antenna system, and implementing a self-sustained capability of the broadband dual-polarized solar cell antenna.

Embodiment 2

Figure 4:
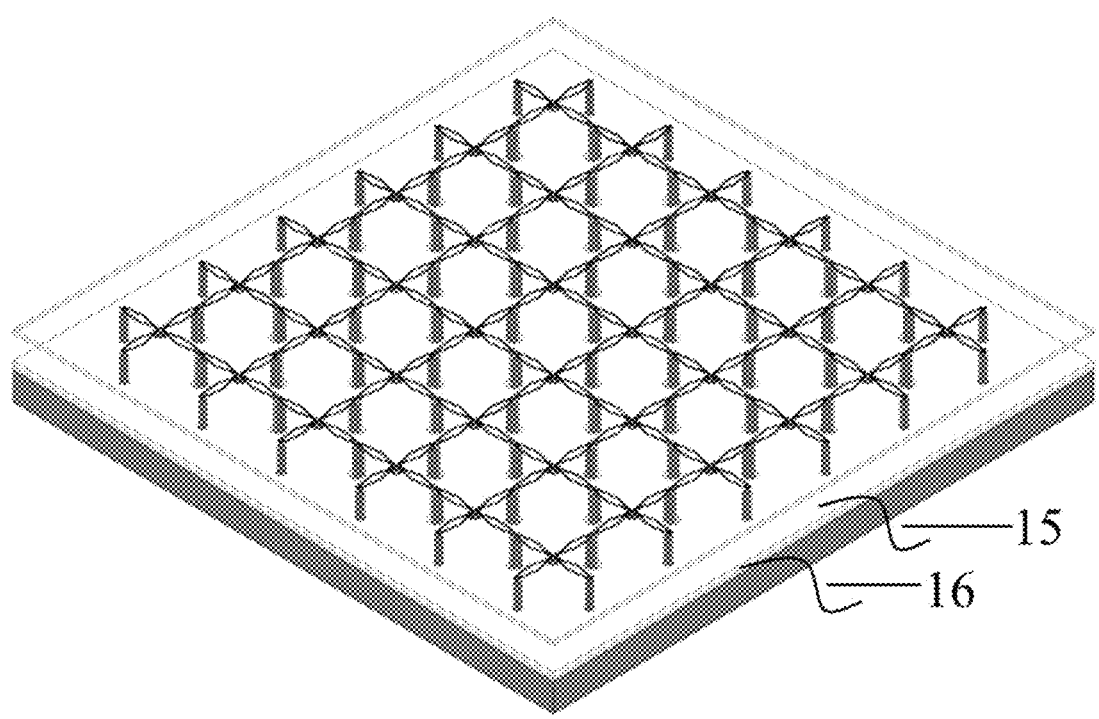
FIG. 4 is a perspective view of an antenna array.
Figure 5:
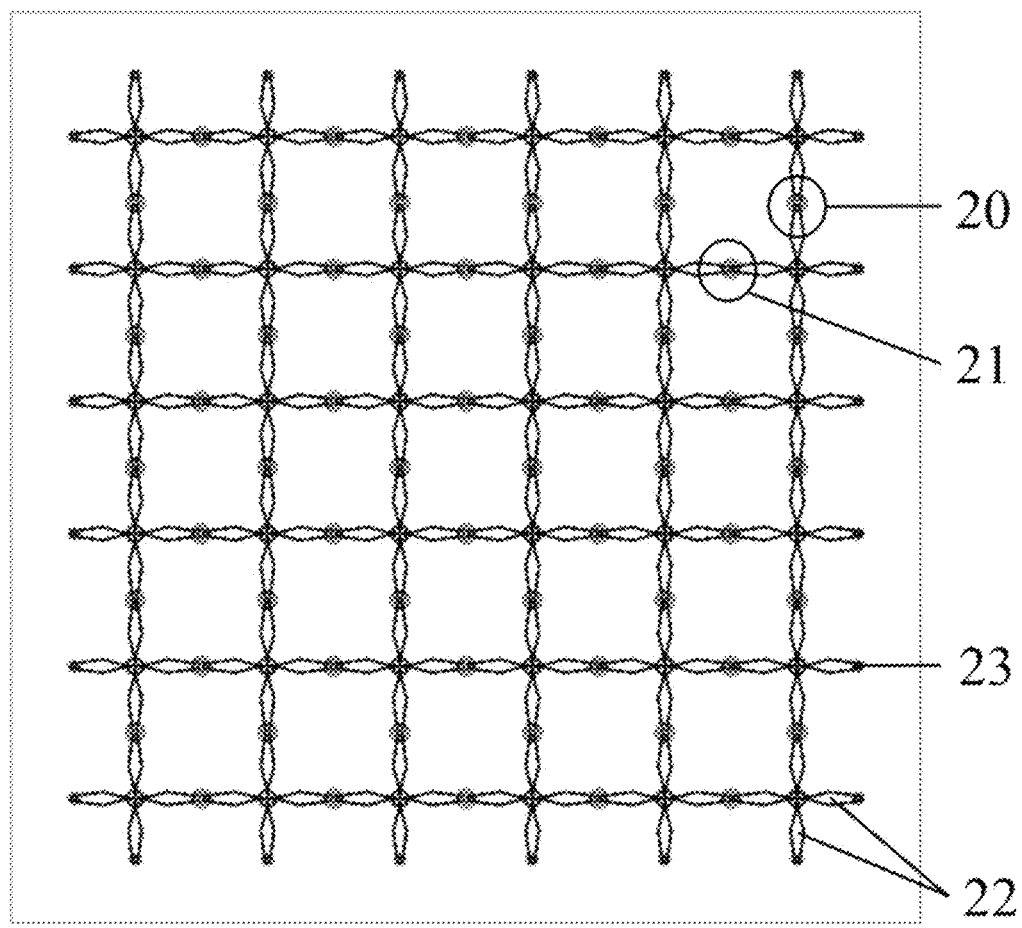
FIG. 5 is a top view of an antenna array.
Figure 6:
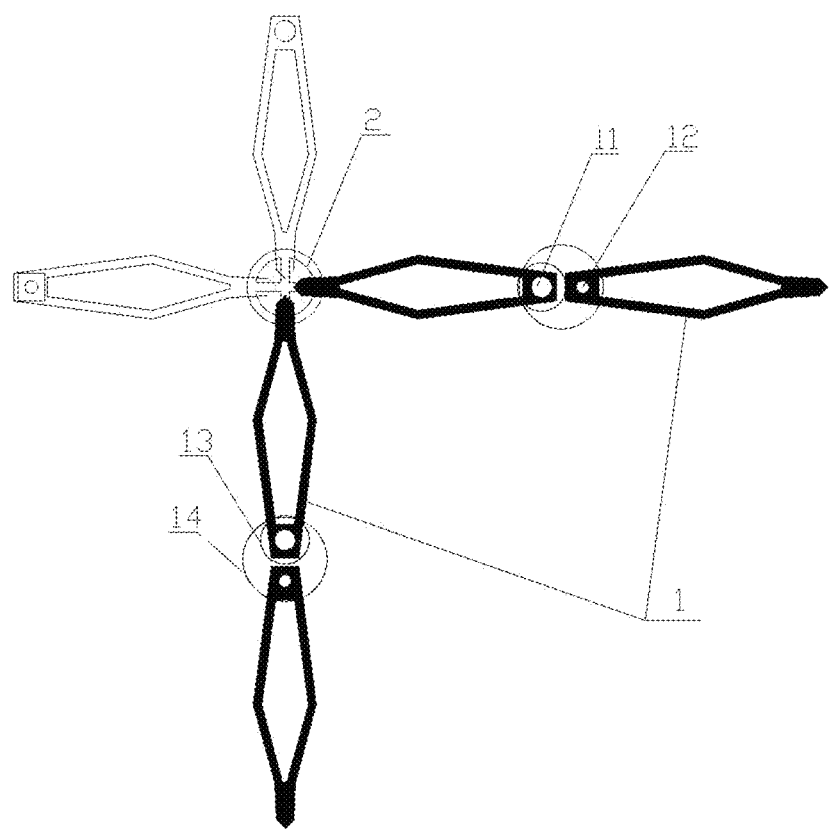
FIG. 6 is a schematic structural view showing the positions of adjacent dual-polarized solar cell antennas.

As shown in FIG. 4, FIG. 5, and FIG. 6, FIG. 4 is a perspective view of an antenna array, FIG. 5 is a top view of an antenna array, and FIG. 6 is a schematic structural view showing the positions of adjacent dual-polarized solar cell antennas. The antenna array is formed by a plurality of the dual-polarized solar cell antennas in a square grid array. The vertically polarized dipole 20 and the horizontally polarized dipole 21 are arranged periodically. The metal feeding probe structure is located in the middle of the "hollowed-out tie" shape of each vertically polarized dipole 20 and the horizontally polarized dipole 21.

To improve the performance of the antenna, a plurality of parasitic dipoles 22 is arranged at four peripheral sides of the antenna array. An outside endpoint of the parasitic dipole 22 is connected to a parasitic metal ground probe 23.

The solar cell 5 refers to a whole cell. An electrode is provided at upper and lower sides of the solar cell 5. A collection line is led out from the two electrodes.

In the square grid array for the antenna with the dual-polarized dipole 1 in the embodiment, the unit spacing is 26.2 mm, the glass substrate 3 is 1.1 mm thick, and the middle air isolation layer 4 is 10.6 mm thick. The dual-polarized antenna can implement two-dimensional (2D) ±45° scanning over the frequency band of 2-6 GHz, and a VSWR during the scanning is less than 3.

The present disclosure combines the performance of the antenna and the performance of the solar cell well. Due to the "hollowed-out tie"-shaped dipole, the antenna shows a broad operating bandwidth and has a desirable sunlight transmission. With the feeding structure including the perpendicular and parallel metal ground probe 9 and metal feeding probe 10, the present disclosure realizes broadband feeding of the antenna. The perpendicular feeding probe is also beneficial in reducing the light shielding. Moreover, the metal probe can further support the antenna dipoles. As the electrical energy generated by the solar cell can be available to the antenna system, the antenna integrated with the solar cell can be applied to solar street lamps, rooftop solar panels, satellite solar panels, etc. Because of a broadband dual-polarized working capability, the broadband dual-polarized solar cell antenna is particularly applied to 5G low-frequency sub-6 GHz transceiver terminals such as a 5G IOV and a 5G BTS, with the high creativity.

The above described are merely preferred embodiments of the present disclosure, and are merely illustrative rather than restrictive. It is to be understood that many alterations, modifications or even equivalent replacements can be made within the spirit and scope defined by the claims of the present disclosure, and all of them should fall within the protection scope of the present disclosure.

What is claimed is:

1. A broadband dual-polarized solar cell antenna, comprising an antenna dipole layer, an isolation layer, a solar cell layer, and a ground that are arranged sequentially from top to bottom, wherein the antenna dipole layer is connected to the ground and a radio frequency (RF) coaxial connector through a metal feeding probe structure, the solar cell layer is placed on the ground, the isolation layer is located between the antenna dipole layer and the solar cell layer, and the isolation layer is made of a transparent material; wherein the antenna dipole layer comprises a dual-polarized dipole, a parasitic patch, and a substrate; the dual-polarized dipole is arranged on the upper surface of the substrate; the parasitic patch is provided on the back surface of the substrate; and the substrate is made of a transparent material; the dual-polarized dipole is of a hollowed-out tie shape, and comprises a vertically polarized dipole and a horizontally polarized dipole; the vertically polarized dipole and the horizontally polarized dipole are provided orthogonally in an L shape; the vertically polarized dipole and the horizontally polarized dipole are connected to the ground through the metal feeding probe structure; and the parasitic patch is located at the crisscrossing points of each four adjacent dipoles on the back surface of the substrate.

2. The broadband dual-polarized solar cell antenna according to claim 1, wherein the parasitic patch is a circular metal-meshed patch.

3. The broadband dual-polarized solar cell antenna according to claim 2, wherein the vertically polarized dipole and the horizontally polarized dipole each are a tie-shaped ring enclosed by a plurality of metal line segments, and each comprises a first dipole portion and a second dipole portion symmetrical to each other; the first dipole portion is not in communication with the second dipole portion; the first dipole portion and the second dipole portion have a hollow design; and two opposite ends of the first dipole portion and the second dipole portion each are provided with a metal portion for connecting the metal feeding probe structure.

4. The broadband dual-polarized solar cell antenna according to claim 3, wherein the metal feeding probe structure comprises a metal ground probe and a metal feeding probe; both the metal ground probe and the metal feeding probe are perpendicular to the ground; the metal ground probe is cylindrical or rectangular; the metal feeding probe is cylindrical; the metal ground probe has a ground weld pin at the upper end; the metal feeding probe has a feeding weld pin at the upper end; and both the ground weld pin and the feeding weld pin are connected to the dual-polarized dipole.

5. The broadband dual-polarized solar cell antenna according to claim 4, wherein both the ground weld pin and the feeding weld pin are cylindrical; a diameter of the feeding weld pin is not greater than a diameter of the metal feeding probe; a diameter of the ground weld pin is less than a side-length or a diameter of the metal ground probe; and a height of each of the ground weld pin and the feeding weld pin is greater than a thickness of the substrate.

6. The broadband dual-polarized solar cell antenna according to claim 4, wherein a lower end of the metal ground probe is connected to the ground; a lower end of the metal feeding probe is connected to a positive electrode of the RF coaxial connector; the RF coaxial connector is provided in the ground; and a cylindrical air feeding hole is formed between the RF coaxial connector and an upper surface of the ground.

7. The broadband dual-polarized solar cell antenna according to claim 4, wherein the solar cell layer comprises a solar cell and an insulating film; the solar cell is isolated from the ground through the insulating film; and the solar cell and the insulating film each are provided with a circular hole at the metal feeding probe and the metal ground probe.

8. An antenna array, formed by a plurality of the dual-polarized solar cell antennas in a square grid array according to claim 1, wherein the vertically polarized dipole and the horizontally polarized dipole are arranged periodically; a plurality of parasitic dipoles are arranged at four peripheral sides of the antenna array; and an outside endpoint of the parasitic dipole is connected to a parasitic metal ground probe.

\* \* \* \* \*